United States Patent
Topaloglu

(10) Patent No.: US 7,671,418 B2
(45) Date of Patent: Mar. 2, 2010

(54) DOUBLE LAYER STRESS FOR MULTIPLE GATE TRANSISTORS

(75) Inventor: Rasit O. Topaloglu, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 151 days.

(21) Appl. No.: 11/855,733

(22) Filed: Sep. 14, 2007

(65) Prior Publication Data

US 2009/0072316 A1 Mar. 19, 2009

(51) Int. Cl.
*H01L 29/78* (2006.01)
*H01L 21/336* (2006.01)

(52) U.S. Cl. ............... 257/365; 438/283; 257/E21.421

(58) Field of Classification Search .............. 257/18, 257/330, E21.376, 365
See application file for complete search history.

(56) References Cited

U.S. PATENT DOCUMENTS

| | | | |
|---|---|---|---|
| 6,759,710 B2* | 7/2004 | Chan et al. ............... | 257/346 |
| 6,855,982 B1* | 2/2005 | Xiang et al. .............. | 257/330 |
| 7,067,868 B2* | 6/2006 | Thean et al. .............. | 257/296 |
| 7,101,762 B2* | 9/2006 | Cohen et al. .............. | 438/283 |
| 7,259,425 B2 | 8/2007 | An et al. | |
| 7,456,058 B1* | 11/2008 | Peidous et al. ............. | 438/182 |
| 2004/0061178 A1 | 4/2004 | Lin et al. | |
| 2004/0152272 A1* | 8/2004 | Fladre et al. .............. | 438/284 |
| 2005/0127412 A1* | 6/2005 | Cohen et al. .............. | 257/288 |
| 2005/0263797 A1 | 12/2005 | Chan et al. | |
| 2006/0076625 A1* | 4/2006 | Lee et al. ................. | 257/353 |
| 2006/0081936 A1* | 4/2006 | Kim et al. ................. | 257/365 |
| 2006/0157784 A1* | 7/2006 | Shima ..................... | 257/347 |
| 2006/0172477 A1* | 8/2006 | Shima ..................... | 438/197 |
| 2007/0120154 A1 | 5/2007 | Zhu et al. | |
| 2007/0138556 A1 | 6/2007 | Dokumaci et al. | |
| 2008/0111195 A1* | 5/2008 | Atanackovic .............. | 257/366 |
| 2009/0079004 A1* | 3/2009 | Licitra et al. ............. | 257/365 |

OTHER PUBLICATIONS

Hon-Sum Philip Wong, et al., "Self-Aligned (Top and Bottom) Double-Gate MOSFET with a 25 nm Thick Silicon Channel," IEDM, 1997, pp. 427-430, IEEE.
H.S. Yang, et al., "Dual Stress Liner for High Performance sub-45nm Gate Length SOI CMOS Manufacturing," IEDM, 2004, pp. 1075-1077, IEEE.
K.W. Guarini, et al., "Triple-Self-Aligned, Planar Double-Gate MOSFETs: Devices and Ciruits," IEDM, 2001, pp. 425-428, IEEE.

* cited by examiner

*Primary Examiner*—Leonardo Andújar
*Assistant Examiner*—William Harriston
(74) *Attorney, Agent, or Firm*—Ditthavong, Mori & Steiner, P.C.

(57) ABSTRACT

Multiple gate transistors are provided with a dual stress layer for increased channel mobility and enhanced effective and saturated drive currents. Embodiments include transistors comprising a first stress layer under the bottom gate and a second stress layer overlying the top gate. Embodiments further include transistors with the bottom gate within or through the first stress layer. Methodology includes sequentially depositing stressed silicon nitride, nitride, oxide, amorphous silicon, and oxide layers on a substrate having a bottom oxide layer thereon, patterning to define a channel length, depositing a top nitride layer, patterning stopping on the stressed silicon nitride layer, removing the amorphous silicon layer, epitaxially growing silicon through a window in the substrate to form source, drain, and channel regions, doping, removing the deposited nitride and oxide layers, growing gate oxides, depositing polysilicon to form gates, growing isolation oxides, and depositing the top stress layer.

37 Claims, 12 Drawing Sheets

DOUBLE LAYER STRESS FOR MULTIPLE GATE TRANSISTORS

FIELD OF THE INVENTION

The present invention relates generally to semiconductor devices having high speed transistors with utility in various products. The present invention is particularly applicable to semiconductor devices having high speed integrated circuits comprising transistors with low parasitic resistance and high effective and saturated drive currents.

BACKGROUND ART

The relentless shrinking of transistor dimensions and market competition require increased charge carrier mobility in the channel region thereby increasing the switching speed of a transistor, as well as enhanced effective and saturated drive currents. However, as transistor dimensions are scaled down, it becomes increasingly difficult to control short-channel effects by conventional means. The short-channel effects decrease the threshold voltage in sub-0.1 micron devices due to two-dimensional electrostatic charge sharing between the gate and source/drain regions.

In response to the demand for smaller and faster devices, multiple-gate field effect transistors have evolved, such as double gate transistors, e.g., planar and vertical double gate transistors. In typical planar double gate transistors, the channel region is confined between top and bottom gate electrode layers. The multiple-gate structure, such as the double gate structure, with a symmetrical gate structure, has several advantages over the conventional single gate field effect transistor, such as higher transconductance, lower parasitic capacitance, and improved short-channel effects. Further, improved short-channel characteristics are obtained without doping of the channel region, thereby circumventing tunneling breakdown, dopant quantization, and dopant depletion problems associated with channel doping normally present with single gate transistors.

One such double gate transistor is a planar double gate transistor, as schematically illustrated in FIG. 1, comprising a bottom or buried oxide layer 11 on substrate 10, bottom or back gate electrode 12, bottom gate oxide 13, channel region 14, top gate oxide 15, top gate electrode 16, source region 17, drain region 18, and a nitride stress layer 19. Difficulties encountered in fabricating double gate transistors, such as the planar double gate transistor illustrated in FIG. 1, include accurate alignment between the bottom and top gate electrodes. Further, as device dimensions continue to shrink, such as for 32 nm, 22 nm, and even smaller designs, further improved performance is required.

Accordingly, there exists a need for semiconductor devices comprising transistors with ultra-fine dimensions, such as 32 nm, 22 nm designs, and under, for improved performance. There also exists a need for efficient methodology enabling the fabrication of such highly miniaturized transistors with high reliability.

DISCLOSURE OF THE INVENTION

An advantage of the present invention is a semiconductor device having transistors with dimensions in the deep submicron range and exhibiting high channel mobility, enhanced effective and saturated drive currents, and reduced short-channel effects.

Another advantage of the present invention is a multiple gate transistor having dimensions in the deep submicron range and exhibiting high channel mobility, enhanced effective and saturated drive currents, and reduced short-channel effects.

A further advantage of the present invention is a method of fabricating an integrated circuit having a multiple gate transistor with highly miniaturized features and exhibiting high channel mobility, enhanced effective and saturated drive currents, and reduced short-channel effects.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device including a transistor comprising: a bottom gate electrode; a top gate electrode; a first stress layer under the bottom gate electrode; and a second stress layer over the top gate electrode.

Another advantage of the present invention is a chip containing an integrated circuit having a multiple gate transistor comprising: a channel region; a first stress layer applying stress to the channel region from a first direction; and a second stress layer applying stress to the channel region from a direction opposite to the first direction.

Embodiments include various types of multiple gate transistors, including planar and vertical double gate transistors and FinFETs, which include a channel formed in a vertical fin. Various embodiments include multiple gate transistors comprising silicon substrates with a bottom or buried oxide layer thereon, and first and second stress layers comprising silicon nitride. Embodiments further include multiple gate transistors having an additional oxide layer on the top nitride stress layer, and/or double gate transistors having an additional oxide layer on the bottom oxide layer with the bottom nitride stress layer extending through the additional oxide layer to the buried oxide layer. Embodiments further include multiple gate transistors wherein the bottom nitride stress layer extends under the source/drain regions, and multiple gate transistors wherein the bottom nitride stress layer is formed directly under the bottom gate electrode and is sandwiched by the source/drain regions. Other embodiments include double gate structures wherein the bottom gate electrode extends partially into the bottom nitride stress layer, and double gate structures wherein the bottom gate electrode extends completely through the bottom nitride stress layer to the buried oxide layer.

A further advantage of the present invention is a method of fabricating an integrated circuit having a multiple gate transistor, the method comprising forming a first stress layer over a substrate; forming bottom and top gate electrodes over the first stress layer; and forming a second stress layer over the top gate electrode.

Embodiments include sequentially depositing a first stress silicon nitride, nitride, oxide, amorphous silicon, and oxide layers over a silicon substrate, patterning to define a channel length, depositing a top nitride layer, etching to form a gate structure pattern stopping on the first stress silicon nitride layer, removing the amorphous silicon to form a channel; forming a window through the first stress silicon nitride layer to the silicon substrate, epitaxially growing silicon through the window to form source, drain, and channel regions, doping the source and drain regions, removing the deposited nitride and oxide layers, growing gate oxide layers, depositing polysilicon to form the bottom and top gate electrodes, and depositing the second silicon nitride stress layer.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 6, in FIGS. 7 through 14, and in FIGS. 15 and 16, similar features are denoted by similar reference characters.

DESCRIPTION OF THE INVENTION

The present invention addresses and solves problems attendant upon providing transistors having ultrafine features suitable for 22 nm designs, and even under. These problems stem from the inability to satisfy demands for increased carrier mobility in the channel region for increased switching speed, and from undesirable short-channel effects. Recent multiple gate transistors have encountered fabrication difficulties in aligning the bottom and top gate electrodes. Further, recent multiple gate transistors fall short of achieving the high channel current mobilities required for even further reduction in design feature sizes less than 20 nm, such as less than 15 nm, e.g., less than 10 nm.

Figure 1:
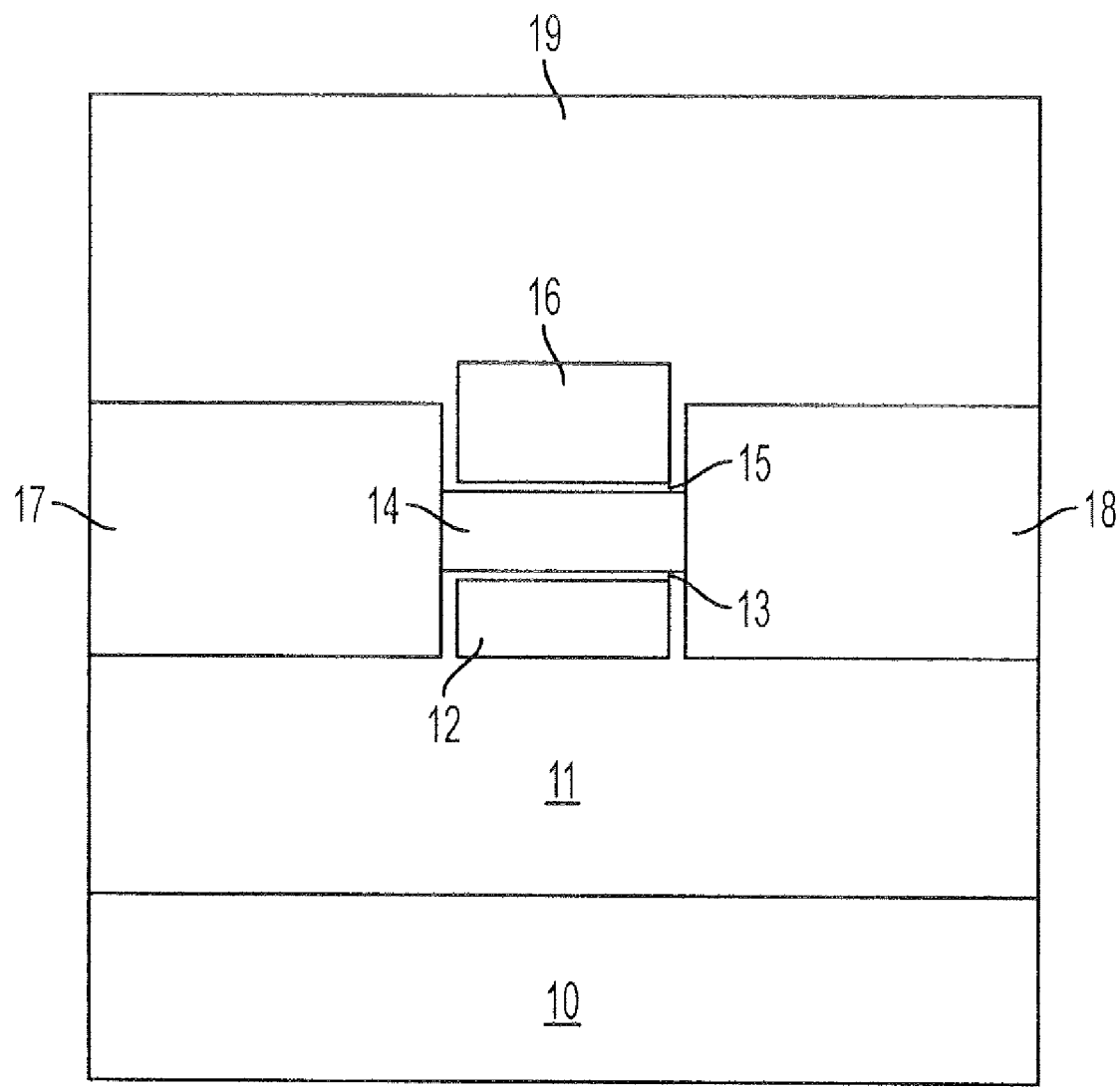
FIG. 1 is a side sectional view schematically illustrating a conventional planar double gate transistor.

The present invention addresses and solves such problems by providing a multiple gate transistor having significantly improved channel mobility, while at the same time providing methodology enabling accurate alignment of the bottom and top gate electrodes. In accordance with embodiments of the present invention, a first stress layer is provided to apply stress to the channel from a first direction and a second stress layer, such as a silicon nitride variant, is provided to apply stress to the channel region from a direction opposite to the first direction. This second stress layer, which exhibits the same type of stress as the top stress layer (19 in FIG. 1), doubles the amount of stress applied to the channel region, thereby doubling charge carrier mobility in the channel region. Embodiments include n-channel (NMOS) transistors, wherein both the top and bottom stress layers exhibit tensile stress, and p-channel (PMOS) transistors, wherein the stress layers exhibit compressive stress.

Figure 2:
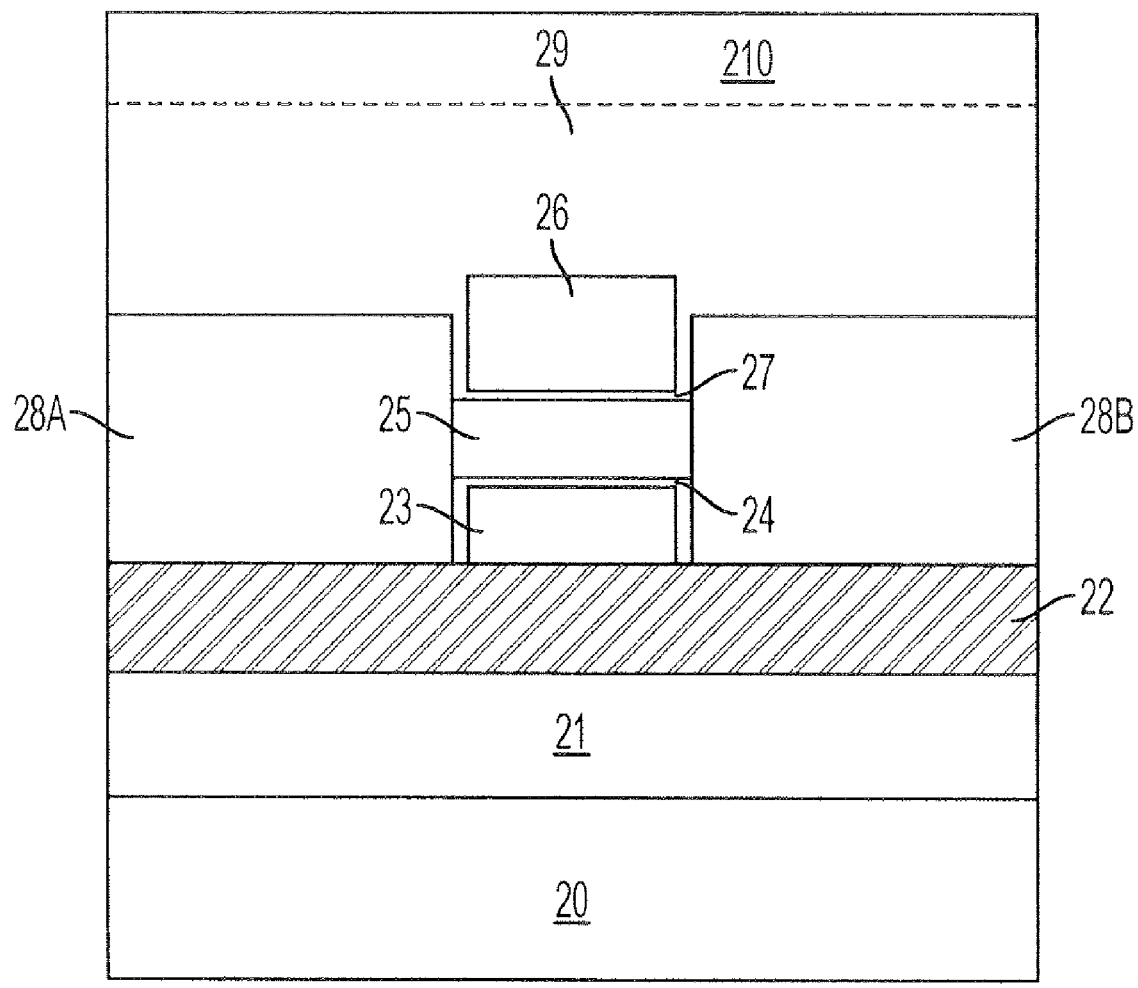
FIG. 2 is a side sectional view schematically illustrating a planar double gate transistor in accordance with an embodiment of the present invention.

A planar double gate transistor in accordance with an embodiment of the present invention is schematically illustrated in FIG. 2 and comprises substrate 20, buried oxide layer 21 thereon, and a first stress layer 22, such as a silicon nitride variant, on buried oxide layer 21. A double gate structure is provided thereon and comprises bottom gate electrode 23, bottom gate oxide 24 on the upper and side surfaces of bottom gate electrode 23, channel region 25, top gate electrode 26, top gate oxide 27 on the bottom and side surfaces of top gate electrode 26, source region 28A, and drain region 28B. A second nitride layer 29, such as a silicon nitride variant, having the same type of stress as first nitride layer 22, is then formed. The illustrated structure effectively results in stress applied to channel region 25 from both first stress layer 22 and second stress layer 29, thereby effectively doubling the charge carrier mobility in the channel region vis-á-vis the transistor illustrated in FIG. 1. Embodiments of the present invention optionally include an additional oxide layer 210 above the second stress layer 29 shown in FIG. 2.

Figure 3:
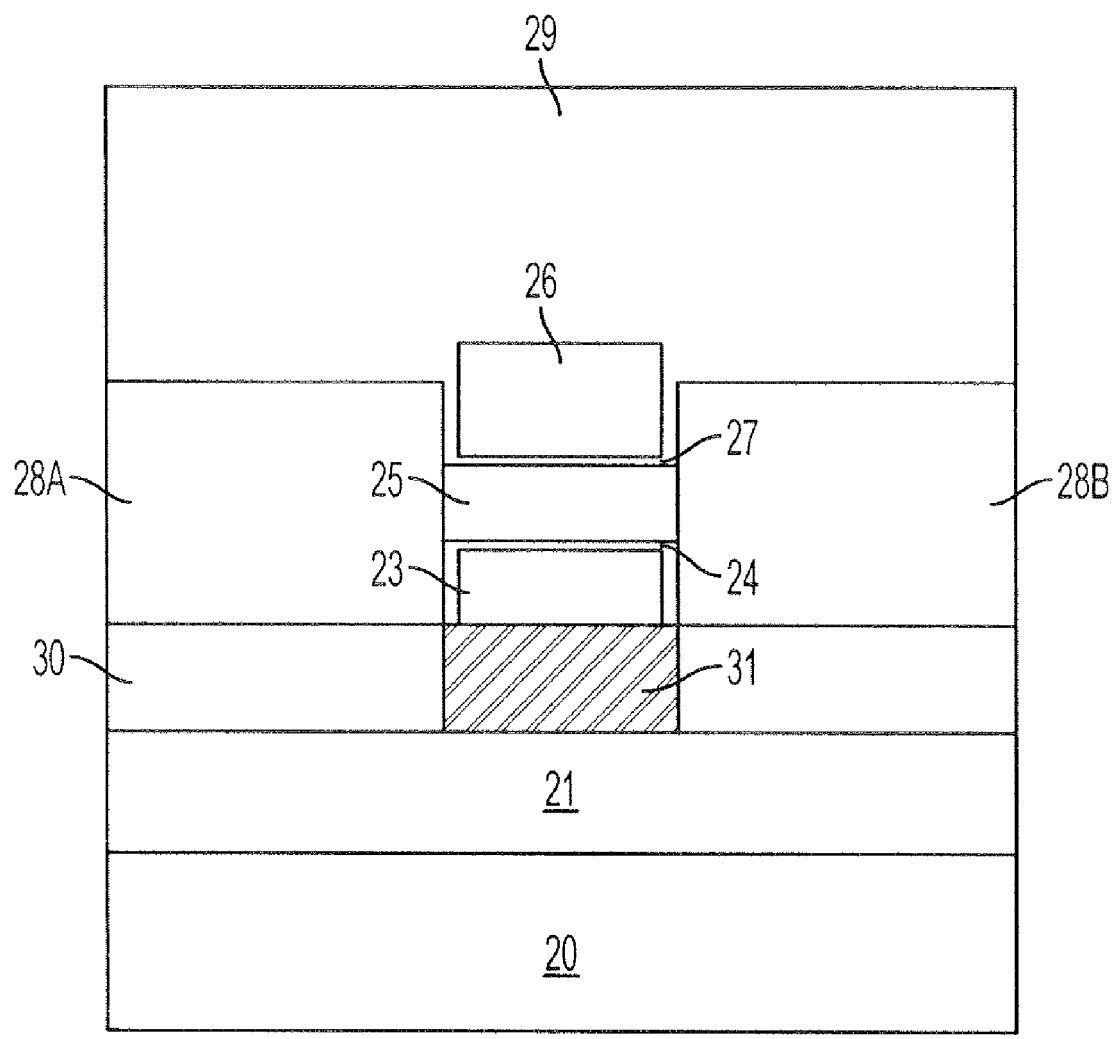
FIG. 3 is a side sectional view schematically illustrating a planar double gate transistor in accordance with another embodiment of the present invention, wherein an additional oxide layer is provided on the buried oxide layer under the source/drain regions.

In the embodiment illustrated in FIG. 2, the first stress layer 22 extends under the source/drain regions 28A, 28B. However, an advantageous increase in charge carrier mobility in the channel region can also be effected by providing the first stress layer directly under the bottom gate electrode without extending under the channel regions. Such an embodiment is schematically illustrated in FIG. 3, wherein features similar to those illustrated in FIG. 2 bear similar reference characters. Thus, the double gate transistor schematically illustrated in FIG. 3, which does not include optional oxide layer 210, comprises substrate 20, which can be silicon, buried oxide layer 21, a gate structure comprising bottom gate electrode 23, bottom gate oxide 24, channel region 25, top gate electrode 26, top gate oxide 27, source region 28A, and drain region 28B. The double gate transistor illustrated in FIG. 3 also includes second stress layer 29. However, unlike the transistor illustrated in FIG. 2, the transistor illustrated in FIG. 3 comprises an additional oxide layer 30 formed on buried oxide layer 21, and the first stress layer 31 is formed directly under the bottom gate electrode 23 but not under source 20A and drain 20B regions.

Figure 4:
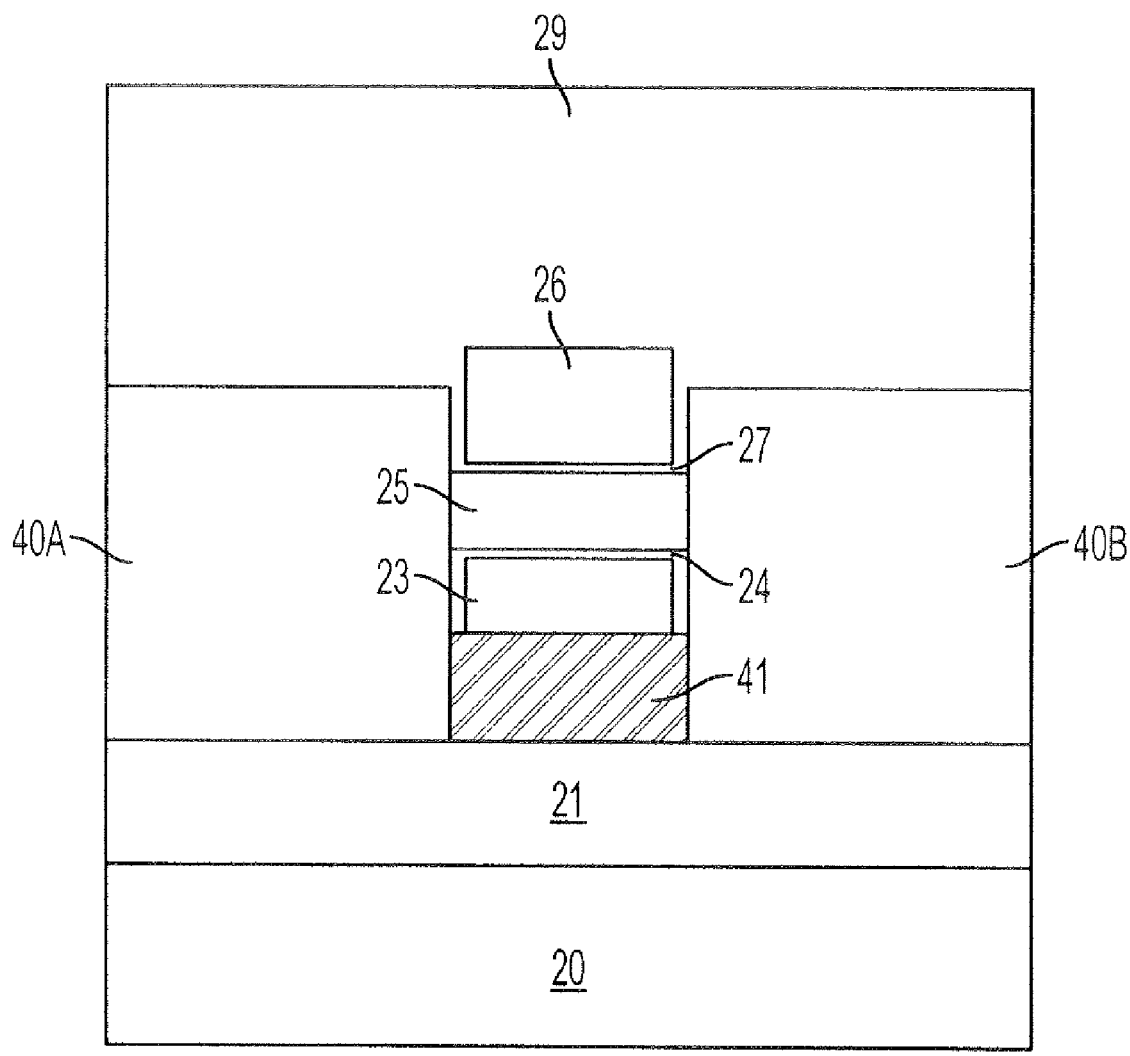
FIG. 4 is a side sectional view schematically illustrating a planar double gate transistor in accordance with another embodiment of the present invention, wherein the bottom stress layer is sandwiched by the source/drain regions.

Another embodiment of a double gate transistor wherein the first stress layer does not extend under the source/drain region is schematically illustrated in FIG. 4, wherein features similar to those illustrated in FIG. 2 bear similar reference characters, noting that optional top oxide layer 210 is omitted. Thus, the double gate transistor illustrated in FIG. 4 comprises substrate 20 and buried oxide 21 thereon. A gate structure comprising bottom gate electrode 23, bottom gate oxide 24, channel region 25, top gate electrode 26 and top gate oxide 27 formed therein, and second stress layer 29. Unlike the transistor illustrated in FIG. 2, the transistor illustrated in FIG. 4 comprises first stress layer 41 directly under bottom gate electrode 23 sandwiched by extended source 40A and drain 40B regions.

Figure 5:
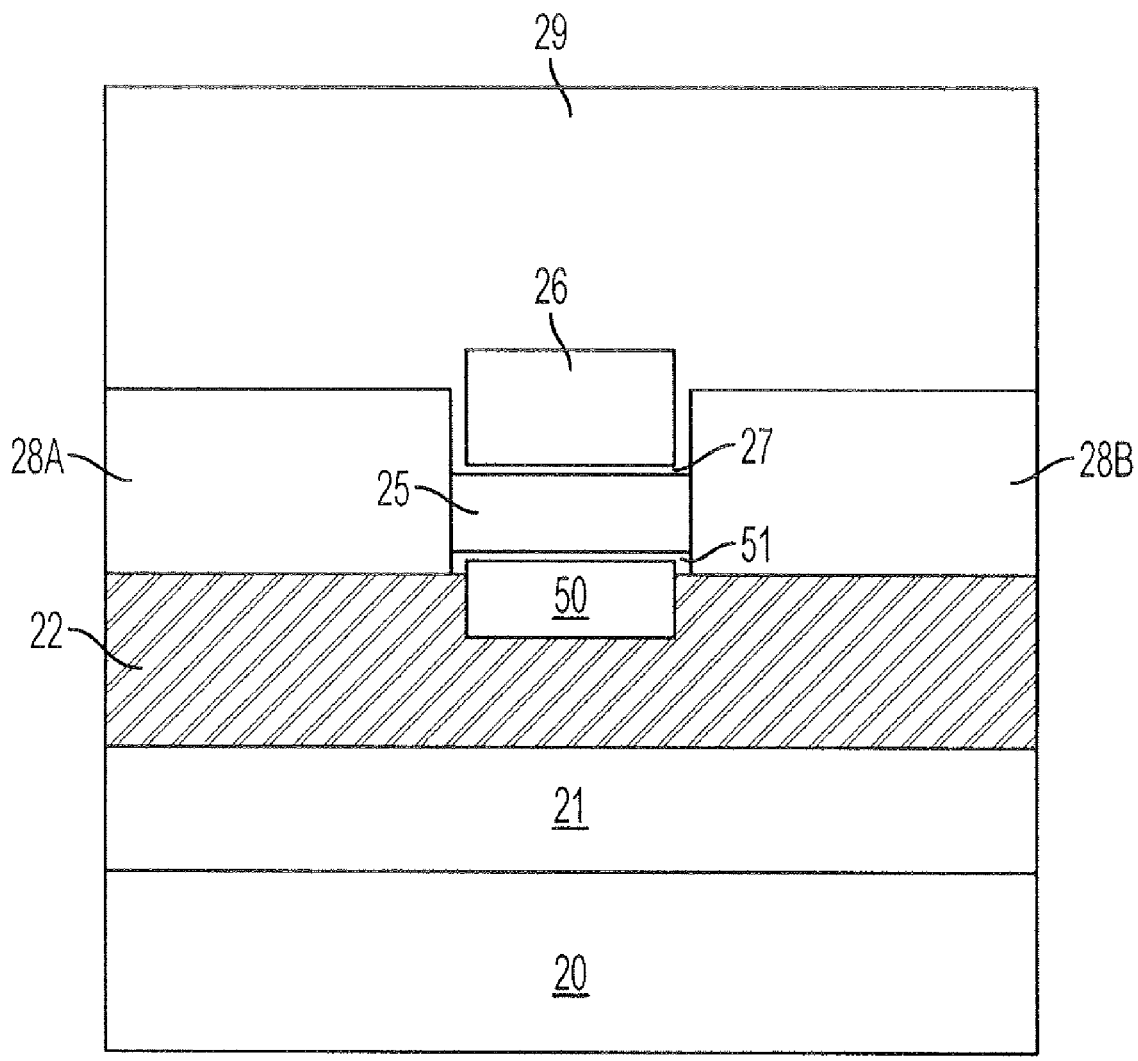
FIG. 5 is a side sectional view schematically illustrating a planar double gate transistor in accordance with a further embodiment of the present invention, wherein the bottom gate electrode extends into the bottom stress layer.

Embodiments of the present invention also include double gate transistors wherein the bottom gate electrode extends into the first stress layer. One such embodiment is schematically illustrated in FIG. 5, wherein features similar to those schematically illustrated in FIG. 2 bear similar reference characters. Thus, the double gate transistor schematically illustrated in FIG. 5 comprises substrate 20 and buried oxide 21 thereon, and first stress layer 22 formed on buried oxide 21. The transistor illustrated in FIG. 5 basically differs from that illustrated in FIG. 2 in that the bottom gate electrode 50 extends into the first stress layer 22, with bottom gate oxide 51 extending on the upper surface and part of the side surfaces of bottom gate electrode 50. The remaining gate structure, similar to that in FIG. 2, comprises channel region 25, top gate electrode 26, top gate oxide 27, source region 28A, and drain region 28B. As in the transistor illustrated in FIG. 2, second stress layer 29 is provided, noting that optional oxide layer 210 is not provided in this embodiment.

Figure 6:
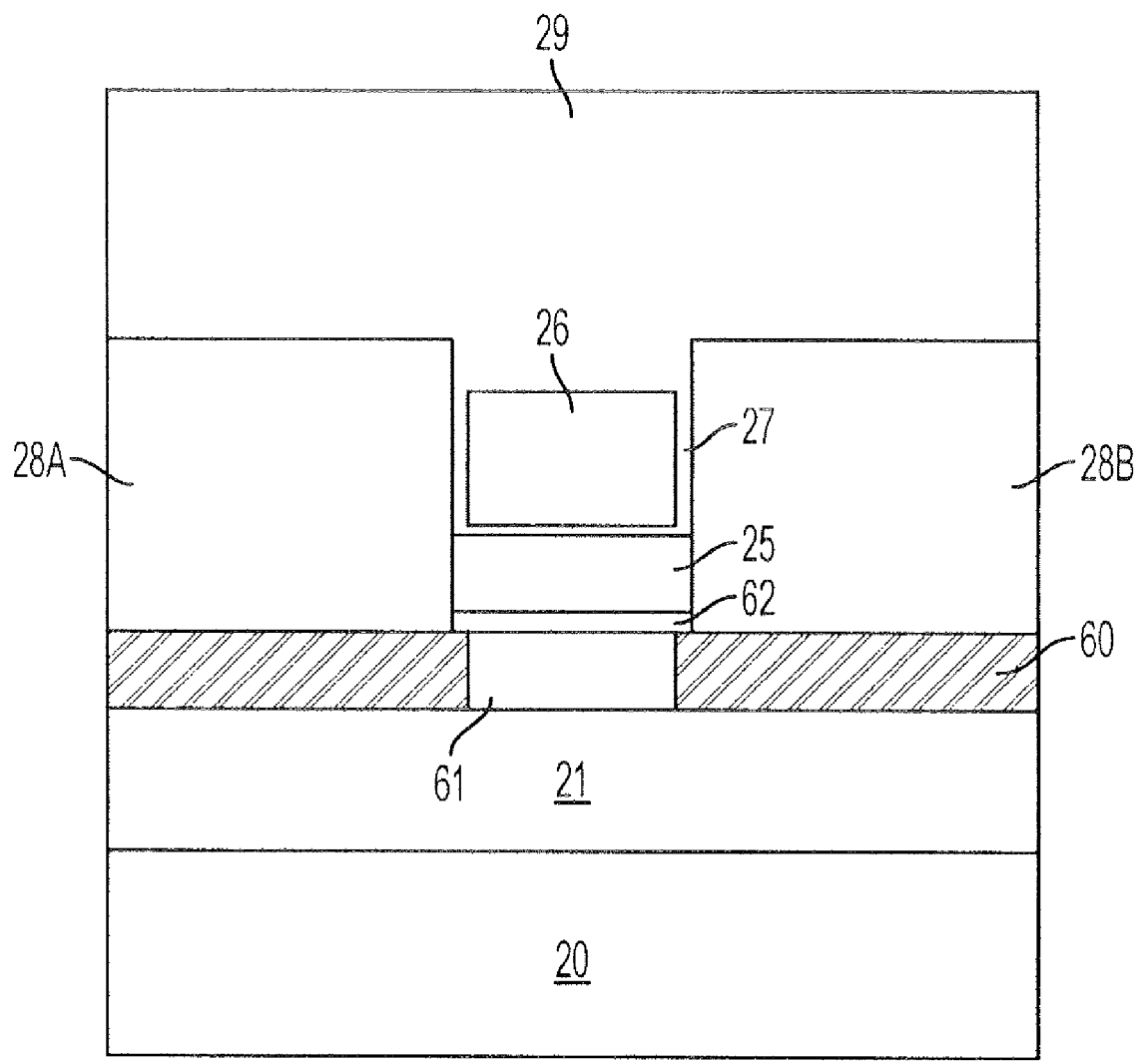
FIG. 6 is a side sectional view schematically illustrating a planar double gate transistor in accordance with another embodiment of the present invention, wherein the bottom gate electrode extends through the bottom stress layer.
Figure 7:
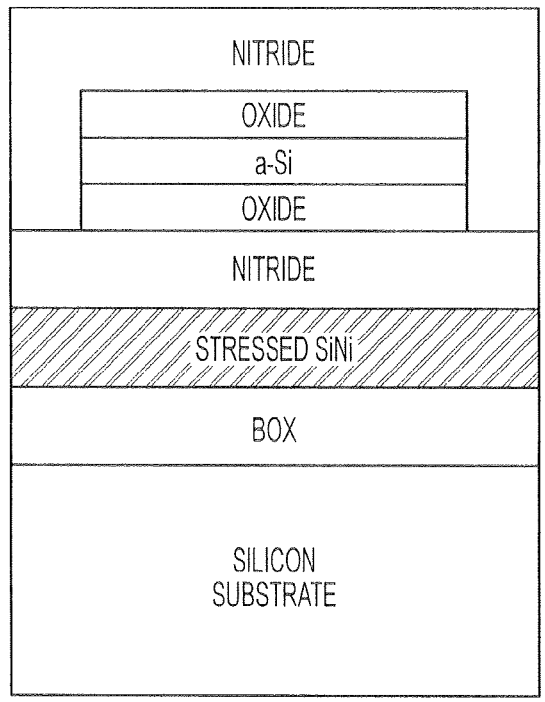
FIGS. 7 through 14 are side sectional views schematically illustrating sequential phases of a method in accordance with an embodiment of the present invention.

Another double gate structure in accordance with an embodiment of the present invention is illustrated in FIG. 6, wherein features similar to those of the transistor illustrated in FIG. 2 bear similar reference characters, noting that optional oxide layer 210 is omitted in this embodiment. Thus, the double gate transistor schematically illustrated in FIG. 6 comprises substrate 20, which can comprise silicon, and buried oxide layer 21 thereon. The transistor illustrated in FIG. 6 basically differs from the transistor illustrated in FIG. 2 in that the bottom gate electrode extends completely through first stress layer 60. Adverting to FIG. 6, first stress layer 60 is formed with an opening therein through which bottom gate electrode 61 is formed, with the bottom gate oxide 62 thereover. The remaining double gate structure basically corresponds to that illustrated in FIG. 2 and comprises channel region 25, top gate electrode 26, top gate oxide 27, source region 28A, and drain region 28B. Second stress layer 29 is provided over the double gate structure. In FIG. 6, the upper electrode 26 may extend below the upper source/drain regions 28A/28B, noting that bottom gate electrode 61 extends entirely through first stress layer 60 to buried oxide layer 21.

In accordance with various embodiments of the present invention, stress is applied to the channel region by the first stress layer and by the second stress layer, thereby effectively doubling the charge carrier mobility in the channel region, providing high switching speeds and high effective and saturated drive currents for devices having ultrafine features deep into the submicron range, such as below 20 nm, or even below 10 nm. Further, the present invention provides methodology enabling the fabrication of such high speed double gate transistors with accurately self-aligned bottom and top gate electrodes, and channel regions.

A method in accordance with an embodiment of the present invention is schematically illustrated in FIGS. 7 through 14, wherein similar features are designated by like reference characters. Adverting to FIG. 7, a silicon substrate is provided with a bottom or buried oxide (BOX) layer thereon. Layers of stressed silicon nitride, nitride, oxide, e.g., silicon oxide, amorphous silicon (a-Si), and oxide, e.g., silicon oxide, are successively deposited on the substrate having the BOX layer thereon. Patterning is then conducted by etching down to the nitride layer forming an oxide, a-silicon, oxide, stack with upper and side surfaces. Another nitride layer, e.g., silicon nitride, is then deposited on the upper and side surfaces of the stack down to the nitride layer resulting in the intermediate structure shown in FIG. 7.

Figure 8:
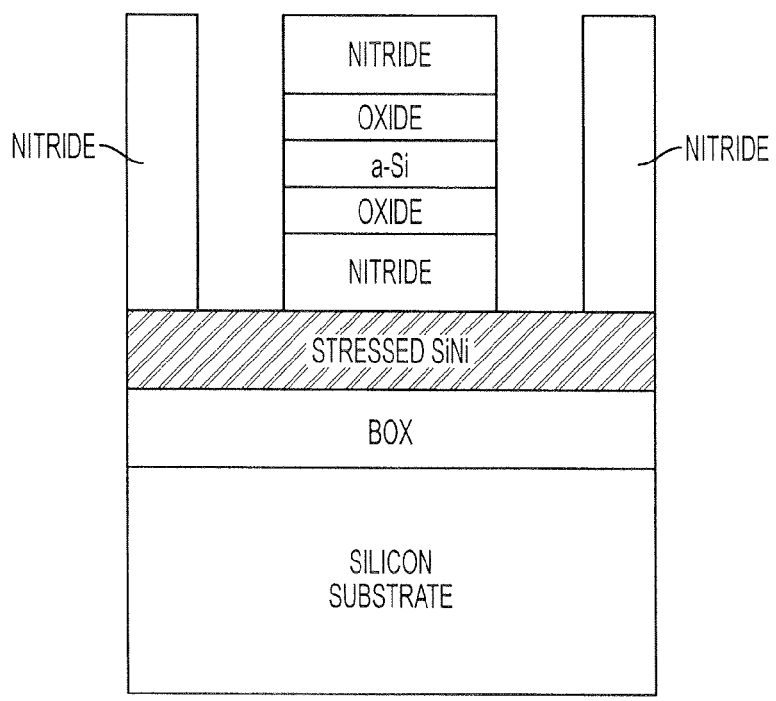

Subsequently, as illustrated in FIG. 8, etching is conducted, as by conventional reactive ion etching (RIE), stopping on the stress silicon nitride layer resulting in the structure illustrated in FIG. 8. The layer of a-Si serves as a space-holder for the channel region. The length of the a-Si space-holder determines the channel length.

Figure 9:
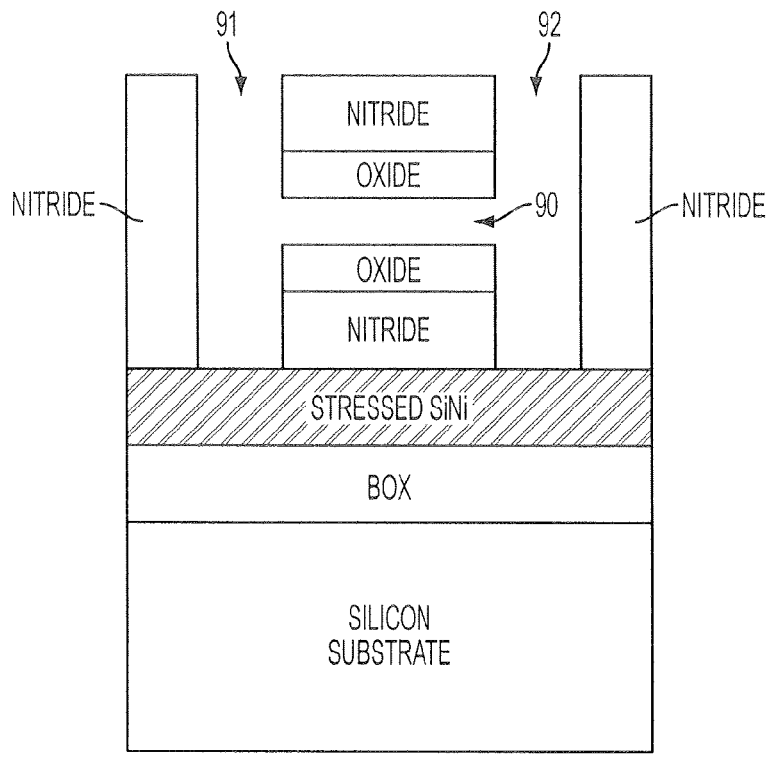

Adverting to FIG. 9, a-Si layer is removed by etching, as by employing potassium hydroxide (KOH), while the structure is maintained in place by the nitride skeleton. The channel region 90 is thus formed with dimensions determined by the previously deposited α-silicon layer and patterning. The tunnel region 90, 91, and 92, held in place by the silicon nitride skeleton, subsequently defines the channel region 90, source region 91, and drain region 92.

Figure 10:
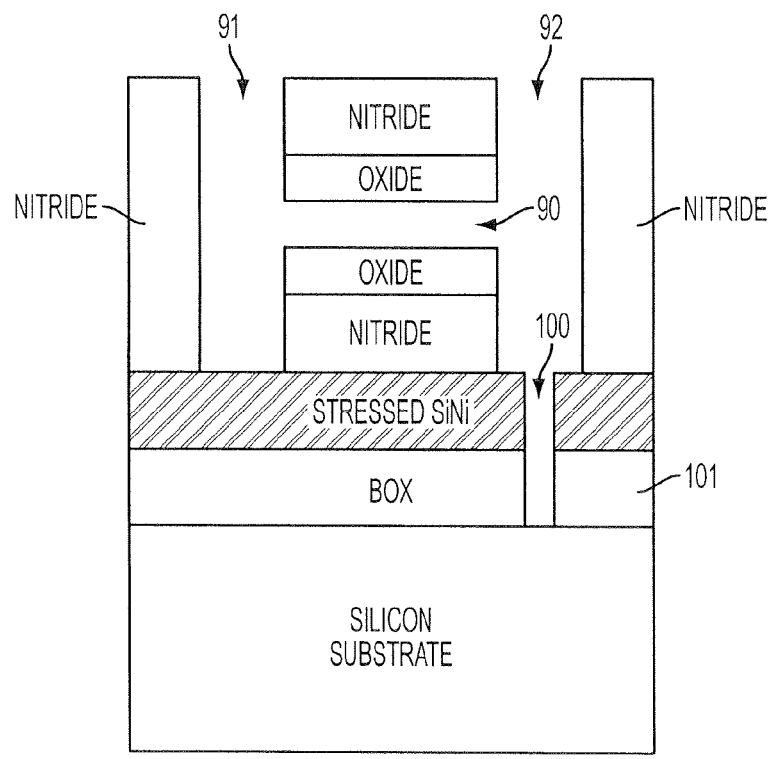

Subsequently, as illustrated in FIG. 10, etching is conducted, as by RIE, through the stressed silicon nitride layer and BOX down to the silicon substrate to create an epitaxial growth window 100, in elliptical region 101.

Figure 11:
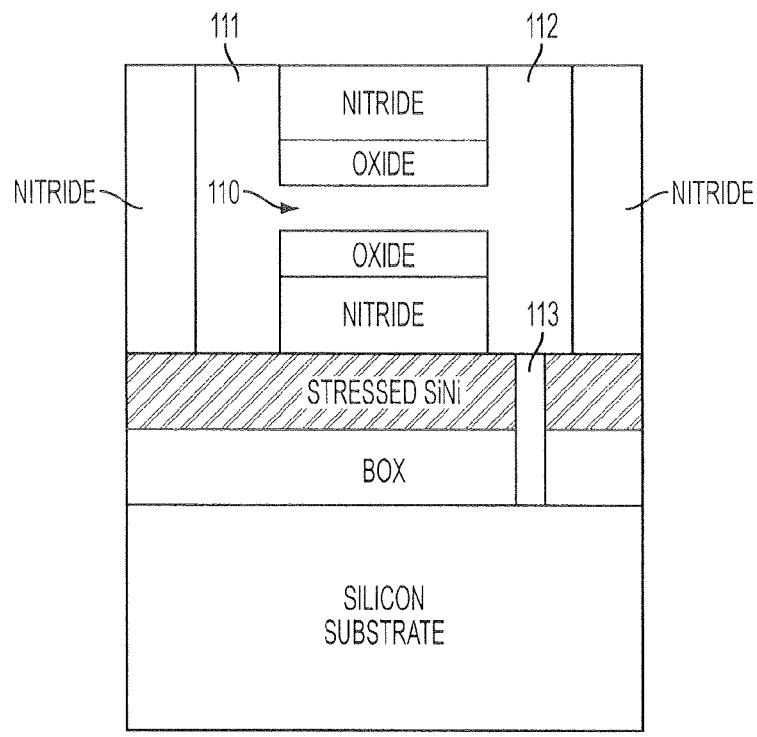

Subsequently, as illustrated in FIG. 11, selective epitaxial growth is conducted, in accordance with a conventional technique, through epitaxial window 10 throughout tunnel region 90, 91, and 92, thereby forming channel region 110, source region 111, and drain region 112. During such epitaxial growth, the epitaxial window is filled with silicon 113. Therefore both the source region 111 and drain region 112 fan out and are formed in self-alignment to the gates. In order to minimize possible leakage through the filled growth window 113, the growth window area can be significantly reduced and the BOX layer increased in thickness to increase resistance. Further, an undoped substrate can be used, thereby elevating resistance, and subsequent source/drain doping can be optimized to avoid dopant penetration into the silicon growth windows. After epitaxial growth, chemical-mechanical polishing (CMP) can be conducted to remove excess silicon from the upper surface of the illustrated intermediate structure. Subsequently the source/drain regions are doped using the nitride layers as self-aligned masks.

Figure 12:
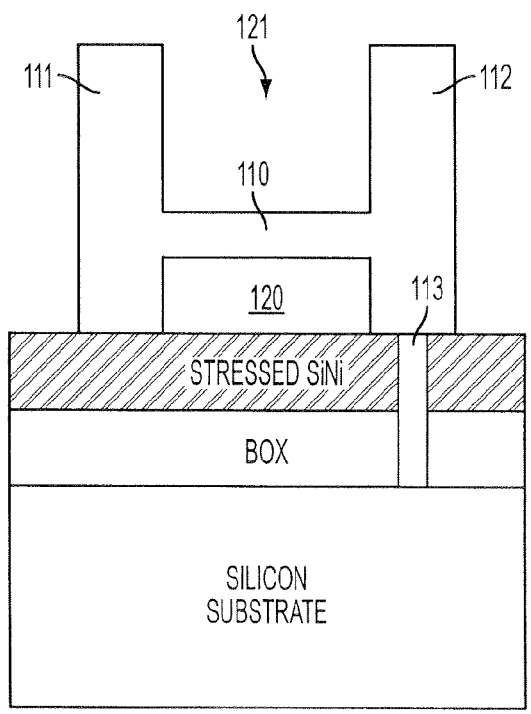

After doping, the nitride layers are removed, as by etching with phosphoric acid ($H_3PO_4$), followed by removing the oxide layers, as by etching with hydrofluoric acid. The resulting structure is illustrated in FIG. 12 and comprises openings 120 and 121.

Figure 13:
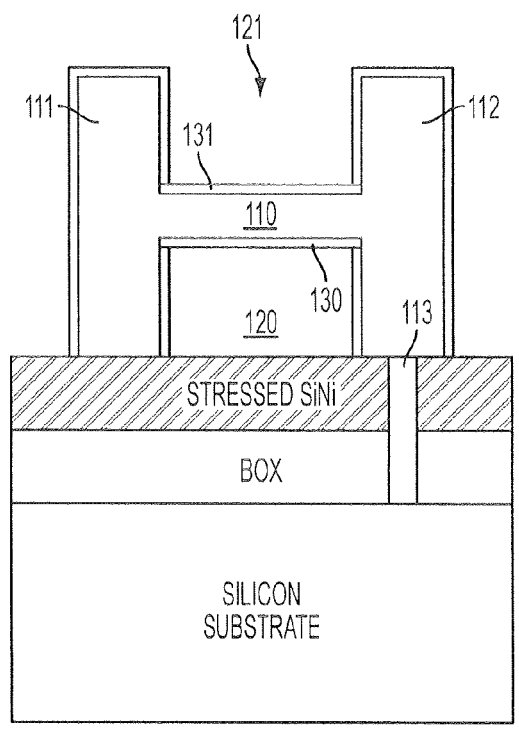
Figure 14:
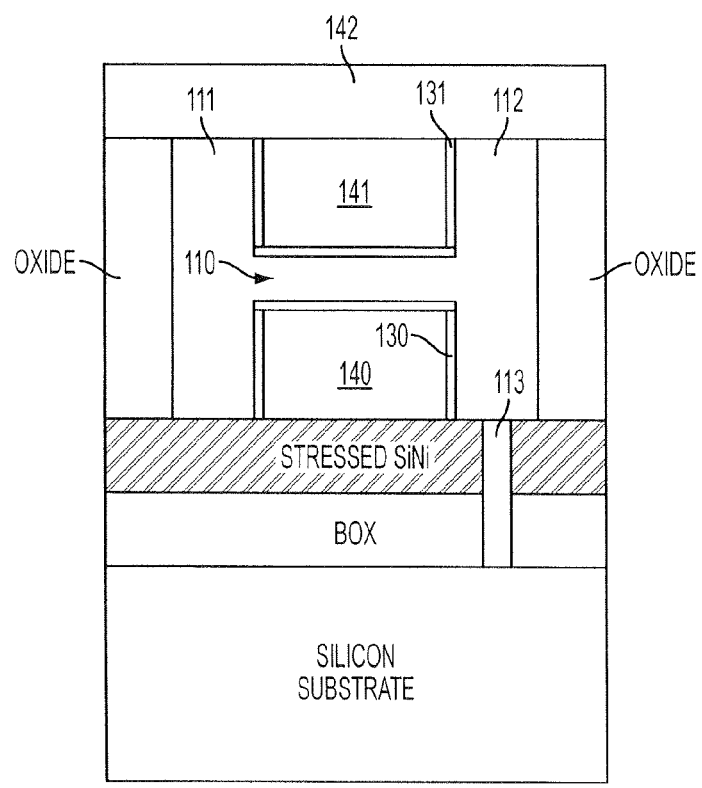

Lower 130 and upper 131 channel oxides are then grown, as by rapid thermal annealing (RTA), to line the epitaxially grown silicon regions, as illustrated in FIG. 13. Polysilicon is then deposited to fill openings 120 and 121, thereby forming lower gate electrode 140 and upper gate electrode 141. After patterning, isolation oxides are formed by elevating the temperature, followed by CMP. Subsequently, the upper stress layer 142 is deposited.

Figure 15:
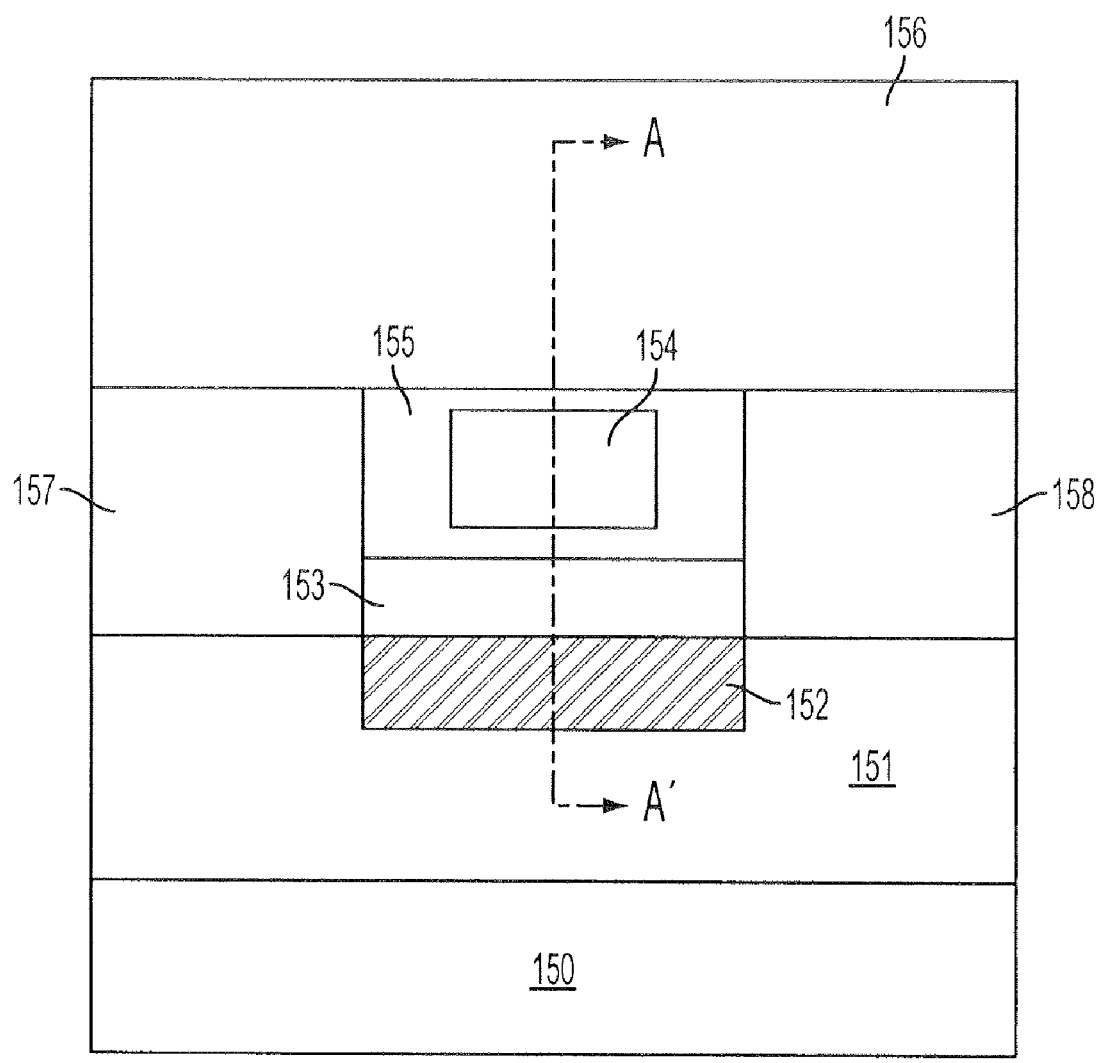
FIG. 15 is a side sectional view schematically illustrating a multiple gate electrode in accordance with another embodiment of the present invention.
Figure 16:
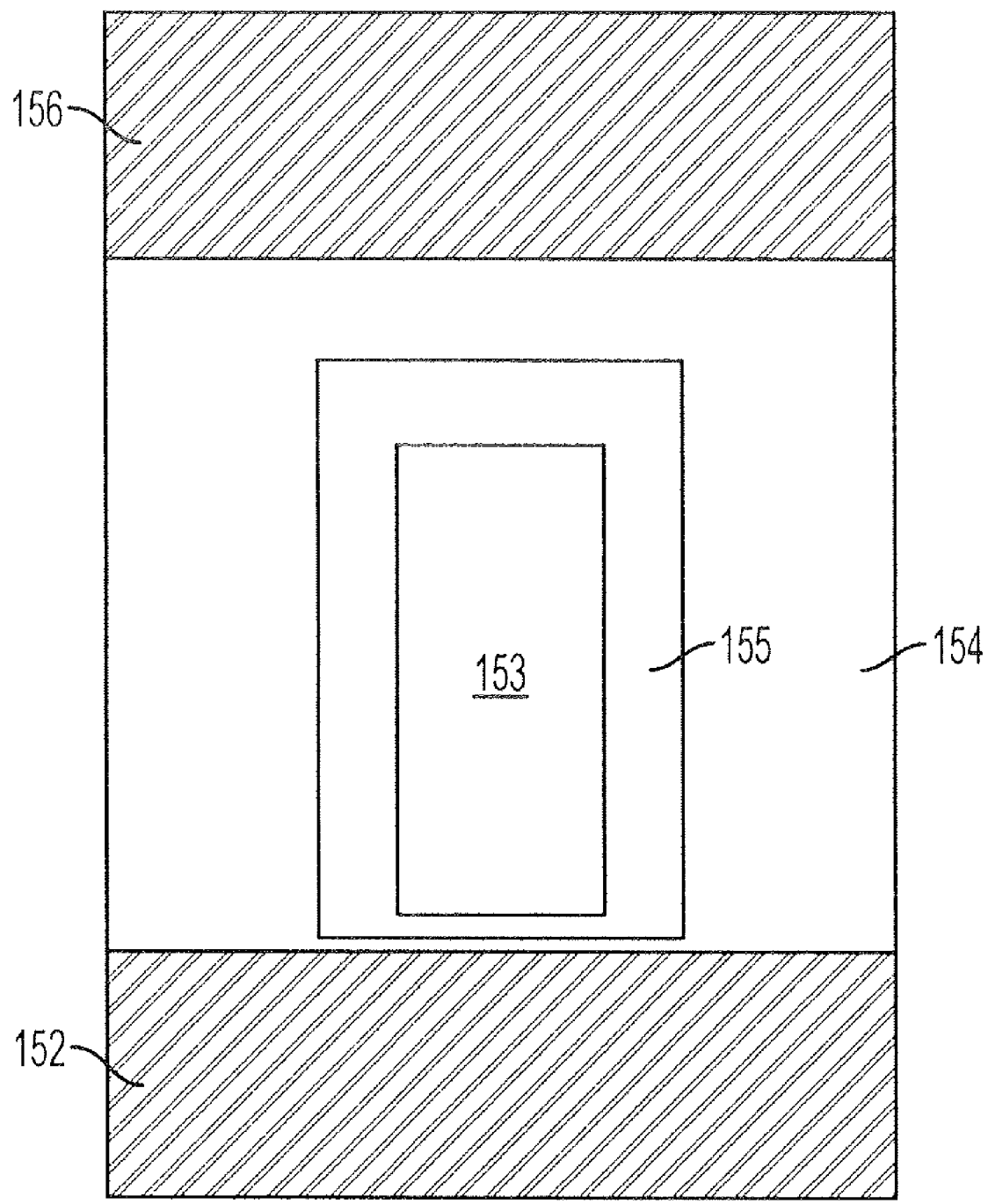
FIG. 16 is a sectional view through line A-A' of FIG. 15.

Embodiments of the present invention can comprise any of various types of multiple gate transistors, including FinFETs. For example, a FinFET structure in accordance with the present invention is schematically illustrated in FIGS. 15 and 16. Adverting to FIG. 15, buried oxide layer 151 is formed on substrate 150. The first stress layer 152 is formed embedded within buried oxide layer 151. The FinFET structure comprises channel region 153, gate electrode 154 and gate oxide 155, typically grown after forming the source/drain and channel regions, source region 157 and drain region 158. The second stress layer 156 is formed thereover effectively applying stress to channel region 153 in a direction opposite from the direction in which stress is applied from first stress layer 152. Viewing the illustrated FiN FET from direction along lines A-A', as schematically shown in FIG. 16 wherein the current direction is into the page, channel region 153 extends vertically, with the gate electrode 154 surrounding the channel from three directions, and first and second stress layers 152, 156, respectively, applying stress to the channel region 153 from opposite directions.

Embodiments of the present invention include various types of multiple gate transistors having reduced short channel effects, enhanced charge carrier mobility in the channel region, and enhanced effective and saturated drive currents. Embodiments of the present invention provide enabling methodology such that the gate electrodes and source/drain regions are inherently self-aligned. Advantageously, methodology in accordance with embodiments of the present invention does not require additional masks to form the bottom stress layer. For example, the same mask can be used to generate a bottom compressive layer for enhanced PMOS devices, and a bottom tensile layer for NMOS devices. The formation of the bottom stress layer enables an increase in speed of up to about 50%, with the resulting devices suitable for use in highly miniaturized designs, such as designs of 22 nm and lower. The present invention enjoys industrial applicability in various types of semiconductor chips useful in various types of industrial applications, particularly chips having highly integrated semiconductor devices exhibiting increased circuit speeds.

In the preceding description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and embodiments and is capable of any changes or modifications within the scope of the inventive concept as expressed herein.

What is claimed is:

1. A semiconductor device including a transistor comprising:
    a bottom gate electrode;
    a top gate electrode;
    a channel region;
    a first stress layer under the bottom gate electrode applying stress to the channel region from a first direction; and
    a second stress layer over the top gate electrode applying stress to the channel region from a second direction opposite to the first direction.

2. The semiconductor device according to claim 1 comprising:
    a substrate;
    the first stress layer over the substrate;
    a gate structure comprising the bottom gate electrode, a channel region, and the top gate electrode, on the first stress layer; and
    source/drain regions on the first stress layer sandwiching the gate structure.

3. The semiconductor device according to claim 2, wherein:
    the bottom gate electrode comprises top and side surfaces;
    the top gate electrode comprises bottom and side surfaces; and
    a gate oxide is on the top and side surfaces of the bottom gate electrode and the bottom and side surfaces of the top gate electrode.

4. The semiconductor device according to claim 2, wherein:
    the substrate comprises a layer of silicon and a buried oxide layer thereon; and
    the first stress layer is on the buried oxide layer.

5. The semiconductor device according to claim 1, further comprising an oxide layer over the second stress layer.

6. The semiconductor device according to claim 1, wherein:
    the first and second stress layers comprise silicon nitride; and
    the bottom and top gate electrodes comprise polysilicon.

7. The semiconductor device according to claim 1, wherein the bottom gate electrode has a bottom and side surfaces extending within the first stress layer.

8. The semiconductor device according to claim 1, wherein bottom and side surfaces of the bottom gate electrode extend entirely through the first stress layer.

9. The semiconductor device according to claim 1, wherein the first stress layer does not extend under source/drain regions.

10. The semiconductor device according to claim 9, further comprising an oxide layer on the buried oxide layer, wherein the first stress layer extends through the oxide layer to the buried oxide layer.

11. The semiconductor device according to claim 9, wherein the first stress layer is sandwiched by the source/drain regions.

12. A chip containing an integrated circuit having a multiple gate transistor comprising:
    a channel region;
    a first stress layer applying stress to the channel region from a first direction; and
    a second stress layer applying stress to the channel region from a second direction opposite to the first direction.

13. The chip according to claim 12, wherein the transistor comprises:
    a substrate comprising a layer of silicon having a buried oxide layer therein;
    a gate electrode;
    a gate oxide; and
    source and drain regions, wherein
    the first stress layer is on the buried oxide layer.

14. The chip according to claim 13, wherein:
    the first stress layer is within the buried oxide layer and does not extend under the source and drain regions;
    the channel region is on the first stress layer and is sandwiched by the source and drain regions;
    the gate electrode comprises upper and lower surfaces and side surfaces; and
    the gate oxide is sandwiched by the source and drain regions and extends on at least the lower and side surfaces of the gate electrode.

15. The chip according to claim 14, wherein the second stress layer is over the gate electrode and extends on the source and drain regions.

16. A chip containing an integrated circuit having a multiple gate transistor comprising:
    a channel region;
    a first stress layer applying stress to the channel region from a first direction;
    a second stress layer applying stress to the channel region from a second direction opposite to the first direction;
    a substrate comprising a layer of silicon having a buried oxide layer therein;
    a gate electrode;
    a gate oxide; and
    source and drain regions, wherein the transistor comprises a gate electrode surrounding at least three sides of the channel region.

17. The chip according to claim 15, wherein the first and second stress layers comprise silicon nitride.

18. A method of fabricating an integrated circuit having a multiple gate transistor, the method comprising:
  forming a first stress layer over a substrate;
  forming bottom and top gate electrodes, with a channel region therebetween, over the first stress layer; and
  forming a second stress layer over the top gate electrode, wherein the first and second stress layers apply stress to the channel region from opposite directions.

19. The method according to claim 18, wherein:
  the substrate comprises a layer of silicon having a bottom oxide layer thereon; and
  the first and second stress layers comprise silicon nitride.

20. The method according to claim 19, comprising:
  sequentially depositing the first silicon nitride layer, and nitride, oxide, silicon and oxide layers, over the substrate;
  patterning to define a channel;
  depositing a top nitride layer;
  etching to form a gate structure stopping on the first stress silicon nitride layer;
  removing the silicon layer to form a channel;
  forming a window through the first stress silicon nitride layer and bottom oxide layer to the substrate;
  epitaxially growing silicon through the window to form source, drain, and channel regions;
  doping the source and drain regions;
  removing the deposited nitride and oxide layers;
  growing gate oxide layers;
  depositing material to form the bottom and top gate electrodes; and
  depositing the second stress silicon nitride layer.

21. A semiconductor device including a transistor comprising:
  a substrate;
  a first stress layer over the substrate;
  a gate structure comprising a bottom gate electrode, a channel region, and a top gate electrode;
  source/drain regions on the first stress layer sandwiching the gate structure;
  a second stress layer over the top gate electrode, wherein the first stress layer is under the bottom gate electrode;
  the bottom gate electrode comprises top and side surfaces;
  the top gate electrode comprises bottom and side surfaces; and
  a gate oxide is on the top and side surfaces of the bottom gate electrode and the bottom and side surfaces of the top gate electrode.

22. A semiconductor device including a transistor comprising:
  a bottom gate electrode;
  a top gate electrode;
  a first stress layer under the bottom gate electrode;
  a second stress layer over the top gate electrode; and
  an oxide layer over the second stress layer.

23. A semiconductor device including a transistor comprising:
  a bottom gate electrode;
  a top gate electrode;
  a first stress layer under the bottom gate electrode; and
  a second stress layer over the top gate electrode, wherein bottom and side surfaces of the bottom gate electrode extend entirely through the first stress layer.

24. A semiconductor device including a transistor comprising:
  a bottom gate electrode;
  a top gate electrode;
  a first stress layer under the bottom gate electrode; and
  a second stress layer over the top gate electrode, wherein the first stress layer does not extend under source/drain regions.

25. The semiconductor device according to claim 24, further comprising an oxide layer on the buried oxide layer, wherein the first stress layer extends through the oxide layer to the buried oxide layer.

26. The semiconductor device according to claim 24, wherein the first stress layer is sandwiched by the source/drain regions.

27. A chip containing an integrated circuit having a multiple gate transistor comprising:
  a channel region;
  a first stress layer applying stress to the channel region from a first direction;
  a second stress layer applying stress to the channel region from a second direction opposite to the first direction;
  a substrate comprising a layer of silicon having a buried oxide layer therein;
  a gate electrode;
  a gate oxide; and
  source and drain regions, wherein:
  the first stress layer is within the buried oxide layer and does not extend under the source and drain regions;
  the channel region is on the first stress layer and is sandwiched by the source and drain regions;
  the gate electrode comprises upper and lower surfaces and side surfaces; and
  the gate oxide is sandwiched by the source and drain regions and extends on at least the lower and side surfaces of the gate electrode.

28. A method of fabricating an integrated circuit having a multiple gate transistor, the method comprising:
  forming a first stress layer over a substrate;
  forming bottom and top gate electrodes over the first stress layer; and
  forming a second stress layer over the top gate electrode, wherein:
  the substrate comprises a layer of silicon having a bottom oxide layer thereon; and
  the first and second stress layers comprise silicon nitride, the method further comprising:
  sequentially depositing the first silicon nitride layer, and nitride, oxide, silicon and oxide layers, over the substrate;
  patterning to define a channel;
  depositing a top nitride layer;
  etching to form a gate structure stopping on the first stress silicon nitride layer;
  removing the silicon layer to form a channel;
  forming a window through the first stress silicon nitride layer and bottom oxide layer to the substrate;
  epitaxially growing silicon through the window to form source, drain, and channel regions;
  doping the source and drain regions;
  removing the deposited nitride and oxide layers;
  growing gate oxide layers;
  depositing material to form the bottom and top gate electrodes; and
  depositing the second stress silicon nitride layer.

29. A chip containing an integrated circuit having a multiple gate transistor comprising:
  a channel region;
  a first stress layer applying stress to the channel region from a first direction;

a second stress layer applying stress to the channel region from a second direction opposite to the first direction; and an oxide layer over the second stress layer.

30. The semiconductor device according to claim 1, comprising:
a substrate; and
a buried oxide layer on the substrate, wherein the first stress layer is on the buried oxide layer.

31. The semiconductor device according to claim 1, wherein the first and second stress layers together substantially doubles charge carrier mobility in the channel region.

32. The chip according to claim 12, wherein the first and second stress layers together substantially doubles charge carrier mobility in the channel region.

33. The method according to claim 18, wherein the first and second stress layers together substantially doubles charge carrier mobility in the channel region.

34. The semiconductor device according to claim 1, wherein each of the first and second stress layers apply the same type of stress.

35. The chip according to claim 12, wherein each of the first and second stress layers apply the same type of stress.

36. The method according to claim 18, wherein each of the first and second stress layers apply the same type of stress.

37. A method of fabricating an integrated circuit having a multiple gate transistor, the method comprising:
forming a first stress layer over a substrate silicon having a bottom oxide layer thereon;
forming bottom and top gate electrodes over the first stress layer; and
forming a second stress layer over the top gate electrode.

* * * * *